(12) United States Patent
Parent et al.

(10) Patent No.: US 7,169,323 B2
(45) Date of Patent: Jan. 30, 2007

(54) FLUORINATED SURFACTANTS FOR BUFFERED ACID ETCH SOLUTIONS

(75) Inventors: Michael J. Parent, Oakdale, MN (US); Patricia M. Savu, Maplewood, MN (US); Richard M. Flynn, Mahtomedi, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 818 days.

(21) Appl. No.: 10/290,765

(22) Filed: Nov. 8, 2002

(65) Prior Publication Data

US 2004/0089840 A1    May 13, 2004

(51) Int. Cl.
C09K 13/00    (2006.01)
C09K 13/04    (2006.01)
C09K 13/06    (2006.01)
H01L 21/302    (2006.01)

(52) U.S. Cl. .................. 252/79.1; 252/79.2; 252/79.4; 438/745

(58) Field of Classification Search ............... 252/79.1, 252/79.2, 79.4; 438/745
See application file for complete search history.

(56) References Cited

U.S. PATENT DOCUMENTS

| | | | |
|---|---|---|---|
| 4,055,458 | A | 10/1977 | Niederprüm et al. |
| 4,370,254 | A | 1/1983 | Mitschke et al. |
| 4,582,624 | A | 4/1986 | Enjo et al. |
| 4,795,582 | A | 1/1989 | Ohmi et al. |
| 5,085,786 | A | 2/1992 | Alm et al. |
| 5,478,436 | A | 12/1995 | Winebarger et al. |
| 5,688,884 | A | 11/1997 | Baker et al. |
| 5,755,989 | A | 5/1998 | Ishii et al. |
| 5,803,956 | A | 9/1998 | Ohmi et al. |
| 5,944,907 | A | 8/1999 | Ohmi |
| 6,310,018 | B1 | 10/2001 | Behr et al. |
| 6,348,157 | B1 | 2/2002 | Ohmi et al. |
| 6,350,489 | B1 | 2/2002 | Moriyama |
| 6,600,557 | B1 | 7/2003 | Stefanescu et al. |
| 6,807,824 | B1 | 10/2004 | Miwa |
| 2002/0089044 | A1 | 7/2002 | Simmons et al. |
| 2002/0142619 | A1 | 10/2002 | Grabbe et al. |
| 2002/0162990 | A1 | 11/2002 | Johnson et al. |
| 2003/0036569 | A1 | 2/2003 | Lamanna et al. |

FOREIGN PATENT DOCUMENTS

| | | | |
|---|---|---|---|
| DE | 3038985 A | * | 5/1982 |
| EP | 0 073 863 A1 | | 3/1983 |
| GB | 1037857 | | 8/1966 |
| WO | WO 97/46283 A1 | | 12/1997 |
| WO | WO 01/30873 A1 | | 5/2001 |
| WO | WO 02/092211 A2 | | 11/2002 |

OTHER PUBLICATIONS

Table, E., Acid-polishing glass at low temperatures—with composition containing sulphuric acid, hydrogen fluoride and added perfluorinated surfactant, May 27, 1982, English Abstract of DE 3038985 A, 2 pages.*
S. Raghavan, "Surfactants in Wet Processing of Silicon", International Symposium on Ultraclean Processing of Silicon Surfaces, (1997), pp. 317-322, Department of Materials Science and Engineering, University of Arizona, Tucson, AZ.
A. M. Almanza, "Adsorption of a Polyglycidol Surfactant From HF and BHF Solutions at Silicon/Solution and Solution/Air Interfaces", Abstract, Symposium Q, Ultraclean Processing of Semiconductor Structures and Devices, (Apr. 7-8, 1999), Materials Research Society [on line], [available and retrieved on the internet Jul. 30, 2002], <http://www.mrs.org/> pp. 1-2.
D. C. Burkman, "Understanding and Specifying the Sources and Effects of Surface Contamination in Semiconductor Processing", Microcontamination, (Nov. 1988), pp. 57-62, 107-112.
K. M. Shah, "Change Your Surfactant Formula and Use Etch Baths for a Week", Semiconductor International, (Oct. 1988), pp. 132-134.
P. D. Haworth, "Interaction of a Polyglycidol-Based Nonionic Surfactant with Silicon in Hydrofluoric Acid Solutions", Journal of the Electrochemical Society, (1999), pp. 2284-2288, vol. 146, No. 6.
J. S. Jeon, "Effect of Temperature on the Interaction of Silicon with Nonionic Surfactants in Alkaline Solutions", Journal of the Electrochemical Society, (Jan. 1996), pp. 277-283, vol. 143, No. 1.
J. S. Jeon, Electrochemincal Investigation of Copper Contamination on Silicon Wafers from HF Solutions, Journal of the Electrochemical Society, (Sep. 1996), pp. 2870-2875, vol. 143, No. 9.
A. M. Almanza-Workman, "In Situ ATR-FTIR Analysis of Surfactant Adsorption onto Silicon from Buffered Hydrofluoric Acid Solutions", Langmuir, (2000), pp. 3636-3640, vol. 16, No. 8, 2000 American Chemical Society.
M. Miyamoto, "Prevention of Microroughness Generation on the Silicon Wafer Surface in Buffered Hydrogen Fluoride by a Surfactant Addition", Journal of the Electrochemical Society, (Oct. 1994), pp. 2899-2903, vol. 141, No. 10, The Electrochemical Society, Inc.
"ICKnowledge", Aluminum Etch, 2001 IC Knowledge [on line], [retrieved from the internet on Apr. 14, 2003], <http://www.icknowledge.com/glossary/a.html>, pp. 1-4.
"Terra Universal Process Control Application Chart", Terra Universal [on line], [retrieved from the internet on Apr. 14, 2003], <http://www.terrauniversal.com/products/wetprocess/processcontrol.html>, pp. 1-2.

(Continued)

Primary Examiner—Nadine G. Norton
Assistant Examiner—Lynette T. Umez-Eronini
(74) Attorney, Agent, or Firm—Kent S. Kokko

(57) ABSTRACT

The present invention is directed to certain fluorinated surfactants, and use thereof in acid etch solutions, such as in aqueous buffered acid etch solutions. The etch solutions are used with a wide variety of substrates, for example, in the etching of silicon oxide-containing substrates.

30 Claims, No Drawings

OTHER PUBLICATIONS

"Metal Wet Bench wbmetal Operating Instructions", "9.2 Aluminum Etch", Stanford Nanofabrication Facility [on line], [last modified Aug. 14, 2000], [retrieved from the internet on Apr. 14, 2003], <http://snf.stanford.edu/Equipment/wbmetal/Operation.html>, pp. 1-14.

"Boe® Premixed Etchants, A complete range of useful thermal oxide etching rates", Technical Data: Boe® Buffered Oxide Etchants, General Chemical, (2000), pp. 1-8.

R. A. Guenthner, "Surface Active Materials from Perfluorocarboxylic and Perfluorosulfonic Acids", I & EC Product Research and Development, (Sep. 1962), pp. 165-169, vol. 1, No. 3.

H. Kikuyama, "Surface Active Buffered Hydrogen Fluoride Having Excellent Wettability for ULSI Processing", IEEE Transactions on Semiconductor Manufacturing, (Aug. 1990), pp. 99-108, vol. 3, No. 3.

G. A. Olah, "Chapter 8 Fluorination with Onium Poly (Hydrogen Fluorides): The Taming of Anhydrous Hydrogen Fluoride for Synthesis", Synthetic Fluorine Chemistry, (1992), pp. 163-204, John Wiley & Sons, Inc.

L. A. Zazzera, "XPS and SIMS Study of Anhydrous HF and UV/Ozone-Modified Silicon (100) Surfaces", Journal of the Electrochemical Society, (Feb. 1989), pp. 484-491, vol. 136, No. 2.

U.S. Appl. No. 10/290,763, filed Nov. 8, 2002, Fluorinated Surfactants for Aqeous Acid Etch Solutions.

* cited by examiner

FLUORINATED SURFACTANTS FOR BUFFERED ACID ETCH SOLUTIONS

FIELD OF THE INVENTION

The present invention is directed to certain fluorinated surfactants, and use thereof in acid etch solutions, such as in aqueous buffered acid etch solutions. The etch solutions are used with a wide variety of substrates, for example, in the etching of silicon oxide-containing substrates.

BACKGROUND

The use of microelectronic devices, such as integrated circuits, flat panel displays and microelectromechanical systems, has burgeoned in new business and consumer electronic equipment, such as personal computers, cellular phones, electronic calendars, personal digital assistants, and medical electronics. Such devices have also become an integral part of more established consumer products such as televisions, stereo components and automobiles.

These devices in turn contain one or more very high quality semiconductor chips containing many layers of circuit patterns. Typically nearly 350 processing steps are required to convert a bare silicon wafer surface to a semiconductor chip of sufficient complexity and quality to be used, for example, in high performance logic devices found in personal computers. The most common processing steps of semiconductor chip manufacture are wafer-cleaning steps, accounting for over 10% of the total processing steps. These cleaning steps are normally one of two types: oxidative and etch (or a combination of the two). During oxidative cleaning steps, oxidative compositions are used to oxidize the silicon or polysilicon surface, typically by contacting the wafer with aqueous peroxide or ozone solution. During etch cleaning steps, etching compositions are used to remove native and deposited silicon oxide films and organic contaminants from the silicon or polysilicon surface before gate oxidation or epitaxial deposition, typically by contacting the wafer with aqueous acid. See, for example, L. A. Zazzera and J. F. Moulder, *J. Electrochem. Soc.,* 136, No. 2, 484 (1989). The ultimate performance of the resulting semiconductor chip will depend greatly on how well each cleaning step has been conducted.

Microelectromechanical systems (MEMS) (also called micromachines or micromechanical devices) are small mechanical devices that can be made using traditional integrated circuit manufacturing techniques. Typical devices include motors, gears, accelerometers, pressure sensors, actuators, mirrors, biochips, micropumps and valves, flow sensor and implantable medical devices and systems. The manufacture of MEMS may result in a chip, or die, which contains the moving pieces of the device made from silicon or polycrystalline silicon (polysilicon) encased in silicon oxide. The die can also contain the circuitry necessary to run the device. One of the final steps in the manufacture of silicon-based MEMS is commonly referred to as "release-etch" and consists of an aqueous etch utilizing hydrofluoric acid (HF) to remove the silicon oxide to free, or "release", the silicon or polysilicon pieces and allow them to move.

For etch cleaning steps, the composition of choice has been dilute aqueous hydrofluoric acid (HF) and, to a lesser extent, hydrochloric acid (HCl). Currently, many semiconductor fabricators employ an "HF-last" etch cleaning process consisting of an etching step using dilute aqueous HF to etch oxides.

In the wet etching of an oxidized silicon substrate, aqueous hydrogen fluoride or a mixture with an onium fluoride complex may be used as an etchant. The onium fluoride present serves to adjust the etching rate and stabilize the solution to variation in HF concentration. These buffered oxide etch solutions, or BOEs have a high surface tension and, as a result, may not adequately wet a substrate or penetrate microscopic surface features.

SUMMARY OF THE INVENTION

The present invention provides aqueous acid etch solution comprising an acid; and a surfactant of the formula:

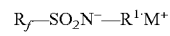

wherein $R_f$ is a $C_1$ to $C_{12}$ perfluoroalkyl group,
$R^1$ is H, an alkyl group, a hydroxyalkyl group, an alkylamine oxide, an alkylcarboxylate group or an aminoalkyl group, and $M^+$ is a cation. Preferably said acid is hydrogen fluoride and/or an onium fluoride complex.

The fluorinated surfactant is sufficiently stable in the aqueous acid etch solution, and advantageously reduces the surface tension thereof so that nanoscale features may be effectively provided to a silicon substrate, such as an integrated circuit and is soluble in the aqueous acid etch solutions. The solution of the instant invention provides one or more of the following advantages: the solution has the same etch rate as conventional etch solutions, possesses low surface tension. In addition it is non-foaming, low in particulates that may contaminate a substrate and leaves low or no surface residues on rinsing. It also offers improved stability of performance when filtered or after extended storage and finally affords excellent substrate surface smoothness.

In another aspect, the present invention provides a buffered oxide etch solution (BOE, also known as buffered hydrogen fluoride or BHF) comprising an aqueous solution of the above-described fluorinated surfactant, hydrogen fluoride and ammonium fluoride. Such solutions are particularly useful in etching of oxidized silicon due to the high $SiO_2/Si$ etch selectivity. Other substrates, including metals and oxides may also be etched and cleaned by appropriate selection of acid or mixtures of acids.

In one aspect, this invention relates to an etch solution useful in semiconductor and integrated circuit manufacture, the composition comprising a fluorinated surfactant, hydrogen fluoride and onium fluoride complex thereof. Advantageously, the present invention provides an aqueous etch solution useful for etching, and removal of residues, that contains a relatively low concentration of surfactant, but effectively wets the substrate and has an efficient rate of etching. Such solutions are particularly useful in etching of $SiO_2$ due to the high $SiO_2/Si$ etch selectivity.

Substrates useful in the present invention include silicon, germanium, GaAs, InP and other III-V and II-VI compound semiconductors. It will be understood, due to the large number of processing steps involved in integrated circuit manufacture, that the substrate may include layers of silicon, polysilicon, metals and oxides thereof, resists, masks and dielectrics. The present invention is also particularly useful in the etch and release of silicon-based microelectromechanical (MEMS) devices. The etch cleaning and drying of MEMS has similar issues to those for semiconductor chip manufacture.

In another aspect, this invention relates to an etch process for substrates by contacting a substrate with a homogeneous etch solution comprising the fluorinated surfactant and acid for a time sufficient to achieve a predetermined degree of etching. In a preferred embodiment, this invention relates to an etch process for substrates by contacting a substrate with a homogeneous etch solution comprising the fluorinated surfactant, HF and/or onium fluoride complex for a time sufficient to achieve a predetermined degree of etching. The present invention provides an etch solution with low surface tension that easily penetrates the intricate microstructures and wets the surfaces on silicon substrates.

It is to be understood that the recitation of numerical ranges by endpoints includes all numbers and fractions subsumed within that range (e.g. 1 to 5 includes 1, 1.5, 2, 2.75, 3, 3.80, 4, and 5). It is to be understood that all numbers and fractions thereof are presumed to be modified by the term "about." It is to be understood that "a" as used herein includes both the singular and plural.

The term "alkyl" refers to straight or branched, cyclic or acyclic hydrocarbon radicals, such as methyl, ethyl, propyl, butyl, octyl, isopropyl, tert-butyl, sec-pentyl, and the like. Alkyl groups include, for example, 1 to 12 carbon atoms, 1 to 8 carbon atoms, or preferably 1 to 6 carbon atoms.

The term "perfluoroalkyl" refers to a fully fluorinated monovalent straight or branched, cyclic or acyclic, saturated hydrocarbon radical such as, for example, $CF_3$—, $CF_3CF_2$—, $CF_3CF_2CF_2$—, $(CF_3)_2CFCF_2CF(CF_3)CF_2$—, $CF_3CF(CF_2CF_3)CF_2CF(CF_3)CF_2$—, and the like. One or more non-adjacent —$CF_2$— groups may be substituted with a catenary oxygen or nitrogen atom such as, for example, $CF_3CF_2OCF(CF_3)CF_2$—, and the like Perfluoroalkyl groups include, for example, 1 to 12 carbon atoms, preferably 3 to 6 carbon atoms.

DETAILED DESCRIPTION

Compositions of this invention, comprising a fluorinated surfactant, an acid such as hydrogen fluoride and onium fluoride complex are useful in the various etch operations performed on substrates such as those that may be required for operations in the manufacture of semiconductors. As used herein "substrate" will refer to wafers and chips used in semiconductor manufacture, including silicon, germanium, GaAs, InP and other III-V and II-VI compound semiconductors. The compositions can effectively convert hydrophilic silicon oxides to soluble or volatile silicon fluorides.

Other substrates, such as metals may also be etched by appropriate selection of the acid. The fluorinated surfactant effectively reduces the surface tension of the aqueous acid, allowing effective wetting of the substrate.

The etch composition and method of this invention can offer enhanced wetting, which is especially important in small geometry patterns and for features with large aspect ratios, reduced particulate contamination, and reduced surface roughness all of which may lead to improvements in manufacturing efficiency by lowering defects to increase wafer yield, by decreasing cleaning times to increase wafer production or by allowing for longer etch bath life by reducing filtration losses of surfactant.

The improved performance is due in part to the low surface tension of the etch solution due to the fluorinated surfactants used, which contributes to the improved wetting of the surfaces. The surface tensions of the etch solutions are generally less than 50 dynes/cm, preferably less than 23 dynes/cm and most preferably between 15 and 20 dynes/cm when measured at 25° C.

The present invention provides an aqueous etch solution comprising an acid and a surfactant of the formula:

wherein $R_f$ is a $C_1$ to $C_{12}$ perfluoroalkyl group,
$R^1$ is H, an alkyl group, a hydroxyalkyl group, an alkylamine oxide group, an alkylcarboxylate group or an aminoalkyl group,
and M+ is a cation. Preferably said acid is hydrogen fluoride and/or an onium fluoride complex.

The $R_f$ group is a perfluorinated alkyl group having from 1 to 12 carbon atoms, with 3 to 6 carbon atoms preferred. The $R_f$ perfluorinated alkyl groups may be unbranched, branched, or cyclic and preferably are unbranched. Catenary heteroatoms such as divalent oxygen, trivalent nitrogen or hexavalent sulfur may interrupt the skeletal chain, (i.e. replace one or more non-adjacent —$CF_2$— groups). When $R_f$ is or contains a cyclic structure, such structure preferably has 5 or 6 ring members, 1 or 2 of which can be catenary heteroatoms. The alkylene radical $R_f$ is also free of ethylenic or other carbon-carbon unsaturation: e.g., it is a saturated aliphatic, cycloaliphatic or heterocyclic monovalent group.

Many previously known fluorinated surfactants contain perfluorooctyl moieties, such as the perfluorooctanesulfonate anion (PFOS). It has been reported that certain perfluorooctyl-containing compounds may tend to bio-accumulate in living organisms; this tendency has been cited as a potential concern regarding some fluorochemical compounds. For example, see U.S. Pat. No. 5,688,884 (Baker et al.). As a result, there is a desire for fluorine-containing surfactants which are effective in providing desired performance, and which eliminate more effectively from the body (including the tendency of the composition and its degradation products).

It is expected that the surfactants of the present invention, which contain anions with relatively short perfluoroalkyl segments (<8 perfluorinated carbon atoms), when exposed to biological, thermal, oxidative, hydrolytic, and photolytic conditions found in the environment, will break down to functional, short chain fluorocarbon degradation products that will not bio-accumulate. For example, compositions of the present invention comprising a perfluorobutyl moiety, such as $CF_3CF_2CF_2CF_2$—, are expected to eliminate from the body more effectively than perfluorohexyl- and much more effectively than perfluorooctyl-. For this reason preferred embodiments of the $R_f$ group in Formula I include perfluoralkyl groups, $C_mF_{2m+1}$— containing a total of 3 to 6 carbon atoms.

The $R^1$ group may be a H, an alkyl, a hydroxyalkyl, an alkylamine oxide or an aminoalkyl group. In particular, $R^1$ may be an alkyl group of the formula —$C_pH_{2p+1}$, a hydroxyalkyl group of the formula —$C_pH_{2p}$—OH, an alkylamine oxide of the formula —$C_pH_{2p}N^+R^3R^4O^-$, an alkylcarboxylate of the formula —$C_pH_{2p}$—$CO_2^-$ or an aminoalkyl group of the formula —$C_pH_{2p}$—$NR^3R^4$, where p is an integer of 1 to 12, preferably 1 to 6 and $R^3$ and $R^4$ are independently H or alkyl groups of one to six carbon atoms. The $R^1$ group may further comprise a catenary oxygen or nitrogen atom, where a —$CH_2$— group is replace by a —O— or —$NR^5$— group wherein $R^5$ is an H—, or a $C_1$ to $C_6$ alkyl group. It is preferred that such catenary atoms are not alpha to a heteroatom, such as may found in the hydroxyalkyl or aminoalkyl groups of the $R^1$ group.

With respect to Formula I, $M^+$ represent an inorganic or organic cation. Suitable inorganic cations include metal cations, including transition metal cations, and alkali- and alkali earth metal cations. Suitable organic cations include onium cations such as ammonium, including primary, secondary, tertiary and quaternary ammonium cations, sulfonium, and phosphonium cations. For many etching application, such as in the preparing of semiconductors, metals may have a deleterious effect on the subsequent electronic performance of the devices and for this reason, ammonium, including primary, secondary, tertiary and quaternary ammonium cations are preferred.

Fluorochemical sulfonamides may be prepared as described in U.S. Pat. No. 4,370,254 (Mitschke et al.). The sulfonamide salt of Formula II may be generated by reacting a compound of the formula $R_f$—$SO_2NR^1H$ with strong base to form a nitrogen-centered anion of the formula $R_f$—$SO_2N^-R^1$.

The etch solution may be prepared by combining, in any order, the aqueous acid and the fluorinated surfactant. Preferably the etch solution comprises hydrogen fluoride and an onium fluoride complex. For oxidized silicon substrates, concentration of hydrogen fluoride may vary widely, i.e. from 0.1 to 49 wt. %, depending on the substrate and the etch rate desired. Generally, the concentration of HF is form about 0.1 to 10 wt. %. If an onium fluoride complex, such as ammonium fluoride, is substituted for all or part of the HF, the amount of the onium fluoride may be determined by the HF acid equivalent.

The invention provides a process for etching a substrate by contacting the substrate with the etch solution of the invention for a time and at a temperature sufficient to effect the desired degree of etching. Preferably, the substrate is an oxidized silicon substrate and the etch solution is a buffered oxide etch solution as described herein. Normally an oxidized silicon substrate is etched at 15 to 40° C. If desired, the etch process may further comprise the step of rinsing the etch solution from the etched substrate. In one embodiment, the solution may be rinsed with water, and preferably deionized water. In another embodiment, the etch solution is slowly replaced with deionized water in a gradient etch process.

The etch process may further including a drying step whereby the rinse solution is removed from the surface of the etched substrate such as by the application or heat, forced air, immersion is a solvent bath, such as an alcohol bath, or immersion is the heated vapors of a solvent such as an alcohol.

For the etching of $SiO_2$ substrates, a mixture of HF and an onium fluoride complex is preferred to stabilize the solution and to reduce the variation in the amount of free HF. Such buffered oxide etch solutions may comprise 0.1 to 10 weight % HF and 20 to 40 weight % of onium fluoride, such as ammonium fluoride. Such solutions will generally have pH values of from 2 to 7.5.

The HF may be aqueous HF per se (i.e. diluted 49% HF), or may be used in the form of an onium fluoride complex. Such complexes, known as "onium poly(hydrogen fluorides)" have the general formula $BH^+(HF)_xF^-$ where B is an electron-pair donor base and x is an integer generally from 1 to 10, and include oxonium-, ammonium-, pyridinium-, and phosphonium-poly(hydrogen fluorides). Such onium complexes are less volatile, less corrosive, and are normally liquids at room temperatures. Many such onium complexes are stable liquids that resist the loss of HF even during distillation. Further information regarding useful onium complexes may be found in *Synthetic Fluorine Chemistry*, George A. Olah, et al, editors, "Fluorination with Onium Poly(hydrogen fluorides): the taming of anhydrous hydrogen fluoride for synthesis", John Wiley and Sons, New York, N.Y., pp. 163–204.

The HF useful in compositions and processes of this invention, whether aqueous HF or an aqueous onium fluoride complex, is preferably substantially free of other contaminants such as metals, particulates and non-volatile residues in order to effectively etch the silicon surface at the maximum rate during the manufacturing process and not leave residues.

If desired, the etch solution may further comprise an organic solvent. In many instances the use of an organic solvent may improve the performance, particularly the post-filtration performance, of the etch solution by improving the solubility of the fluorinated surfactant in the aqueous HF solution. It is believed that organic solvents may advantageously lower the critical micelle concentration of the surfactant. Useful organic solvents may include polar solvents such as ethers, such as diethyl ether or tetrahydrofuran, polyethers such as glymes, alcohols, esters, dimethyl formamide, acetonitrile, acetone, dimethylsulfoxide and carbonates. The selection of solvents may be made with reference to Shah, et al., *Semiconductor International*, October 1988.

If desired, the etch solution may further comprise a second surfactant, in addition to the surfactant of Formula I. Such second surfactants include both fluorinated and non-fluorinated surfactants such as are known in the etching art. Reference may be made to Kikuyama et al., IEEE Transactions on Semiconductor Manufacturing, Vol. 3, 1990, pp 99–108, incorporated herein by reference. Generally, the second surfactant may comprise 0 to 80 weight % of the total surfactant; the total amount of first and second surfactants comprising 10 to 1000 parts per million.

The surfactant is used in amounts sufficient to reduce the surface tension of the solution to the desired degree. For wet etching of silicon substrates, the surfactant is generally used in amounts sufficient to reduce the surface tension of the resulting solution to 50 dynes/cm or less, preferably 23 dynes/cm or less. Generally the solution comprises 10 to 1000 parts per million of surfactant, and is preferably 100 to 500 parts per million. Below 10 parts per million the solution may not exhibit the desirable reduced surface tension and large contact angle on silicon substrate. Above 1000 parts per million, there is little improvement in the properties of the solution or the performance in etching.

The buffered oxide etch solution comprising an aqueous solution of fluorinated surfactant, hydrogen fluoride and onium fluoride, preferably ammonium fluoride, may be used to etch the surface of a silicon wafer. In particular, the solution may be used to etch a $SiO_2$ surface having a resist mask. Conventional buffered oxide etch solutions often failed to wet, and subsequently etch, fine features of such devices leading to defects.

BOE etchants are used in standard oxide etch processes in the IC and MEMS manufacture. While the isotropic etching behavior of BOE can limit its utility, the high selectivity for etching of silicon oxide ($SiO_2$) over silicon (Si) is a tremendous advantage over dry etching processes, such as reactive ion etch (RIE). Conventional BOE solutions fail to fully flow into the small contact holes and some of the oxide remains, thereby creating defects.

Other substrates may also be etched by appropriate selection of the acid or acid mixture. Gold, indium, molybdenum, platinum and nichrome substrates may be etched with a mixture of hydrochloric and nitric acids. Aluminum substrates may be etched with a mixture of phosphoric and nitric acids, and may optionally include acetic acid as a buffer. Silicon substrates may be etched with a mixture of hydrofluoric, nitric and acetic acids. In general, the fluorinated surfactant is used in amounts described for the buffered oxide etch previously described. A SIRTL etch solution may be prepared using a mixture of chromium trioxide and hydrofluoric acid to determine defects in single crystal silicon.

Test Methods

Test Procedure I—Surface Tension Determination

All surface tensions were determined using a Kruss K12 Tensiometer. The program was run using a Wilhelmy platinum plate (PL12) and plastic sample vessel (HDPE). All parts referenced above, except for the plastic sample vessel, but including instrument and computer are available from Kruss USA, Charlotte, N.C.

$pK_a$ Measurement $pK_a$ values were measured by titration with 0.10 N HCl using a computer program included with the Brinkmann Titrino 4.4 software.

JEFF$^{+2}$ is JEFFAMINE™ XJT-500;

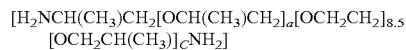

$(a+c=2.5)$; available from Huntsman, Houston Tex.

Preparation of FC-1000; $C_4F_9SO_2NH(C_2H_4OH)$

A 5 L round bottom flask equipped with an overhead stirrer, thermocouple, and reflux condenser was charged with $C_4F_9SO_2NH_2$ (2000 g; 6.69 moles), ethylene carbonate (245 g; 2.78 moles), and sodium carbonate (48.5 g; 0.45 moles; $Na_2CO_3$). The mixture was heated, with stirring, at 120° C. for one hour. At this time more ethylene carbonate (154 g; 1.75 moles) was added and the mixture was heated for an additional 1.5 hours. After additional ethylene carbonate (154 g; 1.75 moles) was added the batch was then heated for an additional 4.5 hours.

The mixture was cooled to 89° C., and deionized water (1000 mL) was added, followed by sulfuric acid (56 g; concentrated). The batch was agitated for 30 minutes and stirring was discontinued, allowing separation into two phases. The upper aqueous phase layer was removed by vacuum aspiration and deionized water (1000 mL) was added to the remaining organic layer and the mixtures was stirred at 89° C. for an additional 30 minutes. The reaction mixture was poured into a separatory funnel and the lower organic phase was separated from the upper aqueous phase to yield 2163 g of crude $C_4F_9SO_2NH(C_2H_4OH)$.

GC analysis indicated that the crude material contained 66% of the desired material. Crude $C_4F_9SO_2NH(C_2H_4OH)$ was placed in a three-liter flask equipped with an overhead stirrer, thermocouple, vacuum gauge, and a six plate sieve tray distillation column along with associated distillation head and receiver. Water was removed under reduced pressure until the pot temperature reached 87° C. (@ 29 mm Hg), followed by fractional distillation. High purity $C_4F_9SO_2NH(C_2H_4OH)$ (greater than 95% gc assay) was collected at head temperatures of 120–134° C., pot temperatures of 156–170° C., and vacuum of 4–9 mm Hg; A total of 1075 g was isolated (correcting for % conversion, the percent yield was 74%).

Preparation of FC-2000; $C_4F_9SO_2NH_2$

A 3-necked round bottom flask fitted with a cold finger condenser (−78° C.), an overhead stirrer, thermocouple and a plastic tube for gas addition was charged with perfluorobutanesulfonyl fluoride (PBSF; 500.0 g; 1.6 moles; available from Sigma-Aldrich Company) and isopropyl ether (600 mL; available from Sigma-Aldrich) and placed in a bath of room temperature water. Ammonia gas (90.0 g; 5.3 mole) was added over a period of 3 hours. The final temperature of the mixture was 13° C.

The mixture was allowed to stir overnight with warming to room temperature, then the solvent was distilled at atmospheric pressure. When the pot temperature reached 95° C., the temperature setpoint was lowered to 74° C. and deionized water added (400 mL) followed by sulfuric acid (100 g conc; 95%) at a rate to maintain the temperature below 85° C. The batch was stirred for about 15 minutes then the upper aqueous phase was removed. The resulting solid was washed with aqueous sulfuric acid (50.0 g; conc; 95% in 400 mL water), then with deionized water (500 mL).

The mixture was heated and solvent removed under vacuum with water flowing through the condenser until the batch temperture reached 75° C. The solid was isolated by distillation at 12 torr and temperature of 120° C. to 160° C. 454 g of white to creme colored solid, $C_4F_9SO_2NH_2$ (96% yield) was obtained.

Preparation of FC-3000; $C_4F_9SO_2N(-)CH_2CH_2OH$ ($K^+$)

$C_4F_9SO_2NH\ CH_2CH_2OH$ (20.1 g; 0.059 moles; as prepared above), KOH (3.9 g; 0.059 mole; 85%) and deionized water (66.0 g) were stirred at room temperature for 30 minutes until a relatively homogenous solution was formed. pH was found to be 12–13. The solution was filtered into a plastic bottle to give 89 g of a 25.3% solids aqueous solution of $C_4F_9SO_2N(-)CH_2CH_2OH$ ($K^+$).

Preparation of FC-4000; $C_4F_9SO_2N(-)H$ ($K^+$)

$C_4F_9SO_2NH_2$ (10.0 g; 0.059 moles; as prepared above), KOH (1.8 g; 0.059 mole; 85%) and 30 g of deionized water (30.0 g) were stirred at room temperature for 30 minutes until a relatively homogenous solution was formed. pH was found to be 12–13. The solution was filtered into a plastic bottle to give 51 g of a 21.8% solids aqueous solution of $C_4F_9SO_2N(-)H$ ($K^+$).

Preparation of FC-5000; $C_4F_9SO_2NHCH_2CH_2CH_2N(CH_3)_2O$

FC-5000 was prepared essentially according to the procedure described in WO 97/46283 A1 (Stern et al.; Preparation of F-1) with the exception that $C_8F_{17}SO_2NHCH_2CH_2CH_2N(CH_3)_2$ was replaced with a molar equivalent of $C_4F_9SO_2NHCH_2CH_2CH_2N(CH_3)_2$.

Preparation of FC-6000; $C_4F_9SO_2N(-)CH_2CO_2Na$ ($K^+$)

A 1 L 3-necked round bottom flask equipped with a mechanical stirrer, thermocouple, reflux condenser and heating mantle was charged with $C_4F_9SO_2NH_2$ (58 g; 0.20 moles; as prepared above), NaOH (8.7 g; 0.22 moles; pellets) and water (60 mL) and heated at 98° C. for 45 minutes. Upon cooling to 76° C., $ClCH_2CO_2Na$ (25 g; 0.22 moles, Sigma-Aldrich) was added and the temperature was then increased to 100° C. and maintained for 18 hours. Water was then added (200 mL) and a white solid appeared. The upper liquid phase was decanted off and discarded leaving the white solid, to which water (250 mL) was added. Water was removed to yield $C_4F_9SO_2N(H)CH_2CO_2Na$ (53.1 g ; 74% yield).

A 2 ounce bottle was charged with $C_4F_9SO_2N(H) CH_2CO_2Na$ (3.1 g), KOH (0.55 g) and deionized water (60 mL). The bottle was shaken until a clear solutions was obtained. This yielded a solution of $C_4F_9SO_2N(-)$ CH₂CO₂Na (K⁺) (4.7%). The pK$_a$ of the C₄F₉SO₂N(-)CH₂CO₂Na (K⁺) solution (4.7%) was determined as describe above. Two endpoints were noted, and the pK$_a$ values associated with those endpoints are listed in Table 1. Surface tension measurements in BOE are reported in Table 2.

Preparation of FC-7000; [C₄F₉SO₂N(-)CH₂CH2OH]₂ JEFF$^{+2}$

A 2 ounce bottle was charged with C₄F₉SO₂N(H)CH₂CH₂OH (2.0 g g; 0.0053 mole; as prepared above) and JEFFAMINE™ XJT 500 (1.24 g; 0.0029 moles). A thick, clear liquid formed which was then heated to 60–80° C. and manually agitated for 5 minutes. The clear viscous liquid was cooled to room temperature to give a clear glass, [C₄F₉SO₂N(-)CH₂CH2OH]₂ JEFF$^{+2}$ (3.24 g) which was readily soluble in water.

An aqueous solution of [C₄F₉SO₂N(-)CH₂CH2OH]₂ JEFF$^{+2}$ (10,000 ppm) was prepared and the surface tension was determined according to Test Procedure I: Surface Tension Measurement described above. The aqueous solution was determined to have surface tension of 20.2 dyne/cm.

TABLE 1

PK$_a$ values of Amides

| Sample | pKa Value |
|---|---|
| C₄F₉SO₂NH₂ | 5.98 |
| C₄F₉SO₂NHCH₂CH₂OH | 6.57 |
| C₄F₉SO₂N(-)CH₂CO₂Na.⁺K | 7.37, 10.14 |

Preparation of Buffered Oxide Etch Examples

A premix of each surfactant was made to facilitate the addition of the surfactant to the 500:1 BOE solution. Premixes nominally contained 2% surfactant by wt. in water alone, a mixture of IPA/deionized water(3:1 by wt.), or a mixture of water/IPA/n-butanol/deionized water (5.4:1.7:1 by wt.). Table 1. The fluorochemical premix was added to a buffered oxide etch solution (BOE 500:1 Buffered oxide etch solution; available from Ashland Chemical, Dublin, Ohio) in an amount such that the resulting surfactant concentration was 500 ppm, unless otherwise noted in Table 2.

Surface tension measurements were then made on the unfiltered and filtered solutions (Vacuum Filter/Storage Systems, Sterile 0.22 micron PES Membrane, 50 mm filter diameter, 250 mL Receiver cap; available from Corning, Corning, N.Y.) according to Test Procedure I: Surface Tension Determination described above. Results are listed in Table 2.

TABLE 2

Surface tension values (dyne/cm) for 500:1 BOE solutions containing surfactants at given concentrations.

| Example | Fluorochemical | Premix Solvent | Surface Tension in dyne/cm (post-filtered) |
|---|---|---|---|
| C1 | none added | none added | 93.0 (93.0) |
| C2 | FLUORAD™ FC-23** | DI Water | 66.3 (66.9) |
| C3 | FC-17 | DI Water | 39.2 (73.6) |
| C4 | n-octylamine (@ 1000 ppm) | DI Water | 22.7 (22.9) |
| 1 | FC-3000 | DI Water | 17.7 (18.5) |
| 2 | FC-4000 | DI Water | 19.5 (*) |

TABLE 2-continued

Surface tension values (dyne/cm) for 500:1 BOE solutions containing surfactants at given concentrations.

| Example | Fluorochemical | Premix Solvent | Surface Tension in dyne/cm (post-filtered) |
|---|---|---|---|
| 3 | FC-5000 | IPA/DI Water | 21.1 (30.8) |
| 4 | FC-6000 | DI Water | 11.1 (29.8) |

*not measured
**Available from 3M Company, St. Paul, MN.
FC-17 can be prepared essentially according to WO 01/30873 A1 Example 1.

We claim:

1. An aqueous etch solution comprising:
   a) an onium fluoride complex is selected from pyridinium poly(hydrogen fluoride), oxonium poly(hydrogen fluoride), ammonium poly(hydrogen fluoride), and phosphonium poly(hydrogen fluoride), and
   b) a surfactant of the formula:

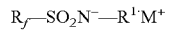

wherein
   R$_f$ is a C₁ to C₁₂ perfluoroalkyl group,
   R¹ is H, an alkyl group, a hydroxyalkyl group, an alkylamine oxide group, an alkylcarboxylate group or an aminoalkyl group, and M⁺ is a cation.

2. The etch solution of claim 1 wherein said alkyl, hydroxyalkyl, alkylamine oxide, alkylcarboxylate or aminoalkyl groups of said R¹ group have from 1 to 6 carbon atoms.

3. The etch solution of claim 2 wherein said hydroxyalkyl group is of the formula —C$_p$H$_{2p}$—OH, where p is an integer of 1 to 6.

4. The etch solution of claim 2 wherein said aminoalkyl group is of the formula —C$_p$H$_{2p}$—NR³R⁴ where p is an integer of 1 to 6 and R³ and R⁴ are independently H or alkyl groups of one to six carbon atoms.

5. The etch solution of claim 1 wherein R$_f$ is a C₃ to C₆ perfluoroalkyl group.

6. The etch solution of claim 1 wherein said cation is an alkali metal, and alkaline earth metal, a transition metal, or an onium ion.

7. The etch solution of claim 6 wherein said onium ion is an ammonium ion.

8. The etch solution of claim 1 comprising 10 to 1000 parts per million of said surfactant.

9. The etch solution of claim 1 comprising 100 to 500 parts per million of said surfactant.

10. The etch solution of claim 1 comprising 0.1 to 49 weight percent onium fluoride complex thereof.

11. The etch solution of claim 1 having a pH of 2 to 7.

12. The etch solution of claim 1 comprising 0.1 to 10 weight % HF and 20 to 40 weight % of ammonium fluoride.

13. The etch solution of claim 1 having a surface tension of 23 dynes/cm or less.

14. A method of etching comprising contacting a substrate with the etch solution of claim 1.

15. The method of claim 14 wherein said solution contacts said substrate for a time sufficient to achieve a predetermined degree of etching.

16. The method of claim 14 wherein said substrate is a silicon substrate.

17. The method of claim 16 wherein said silicon substrate is contacted by said solution in a predetermined pattern.

18. The method of claim 17 wherein said predetermined pattern is achieved by masking preselected portions of said substrate.

19. The method of claim 14 wherein said $R_f$ of said surfactant is a $C_3$ to $C_6$ perfluoroalkyl group.

20. The method of claim 14 wherein said cation, $M^+$, of said surfactant is an alkali metal, and alkaline earth metal, a transition metal, or an onium ion.

21. The method of claim 20 wherein said onium ion is an ammonium ion.

22. The method of claim 14 wherein said etch solution comprises 10 to 1000 parts per million of said surfactant.

23. The method of claim 14 wherein said etch solution comprises 100 to 500 parts per million of said surfactant.

24. The method of claim 14 wherein said etch solution comprises 1 part hydrogen fluoride and 5 to 500 parts of ammonium fluoride.

25. The method of claim 14 wherein said etch solution has a surface tension of 23 dyne/cm or less.

26. The method of claim 14 wherein said acid of said etch solution wherein said acid is hydrogen fluoride and/or an onium fluoride complex thereof.

27. The method of claim 26 wherein said onium fluoride complex is selected from pyridinium poly(hydrogen fluoride), oxonium poly(hydrogen fluoride), ammonium poly(hydrogen fluoride), and phosphonium poly(hydrogen fluoride).

28. An aqueous cleaning solution comprising:
a) an onium fluoride complex is selected from pyridinium poly(hydrogen fluoride), oxonium poly(hydrogen fluoride), ammonium poly(hydrogen fluoride), and phosphonium poly(hydrogen fluoride), and
b) a surfactant of the formula:

$$R_f\text{—}SO_2N^-\text{—}R^1 \cdot M^+$$

wherein
$R_f$ is a $C_1$ to $C_{12}$ perfluoroalkyl group,
$R^1$ is H, an alkyl group, a hydroxyalkyl group, an alkylamine oxide group, an alkylcarboxylate group or an aminoalkyl group, and $M^+$ is a cation.

29. The etch solution of claim 1 comprising a mixture of said surfactants.

30. The etch solution of claim 1 comprising a second fluorinated or non-fluorinated surfactant.

* * * * *

UNITED STATES PATENT AND TRADEMARK OFFICE
CERTIFICATE OF CORRECTION

PATENT NO. : 7,169,323 B2
APPLICATION NO. : 10/290765
DATED : January 30, 2007
INVENTOR(S) : Michael J. Parent Page 1 of 1

It is certified that error appears in the above-identified patent and that said Letters Patent is hereby corrected as shown below:

<u>On the Title Page, in Col. 2, under (Other Publications) Reference P.D. Haworth</u>
Line 27, delete "Electrochemincal" and insert -- "Electrochemical --, therefor.

<u>Col. 5</u>
Line 58, delete "$BH^+(HF)_xF^{--}$" and insert -- $BH^+(HF)_xF^-$, --, therefor.

<u>Col. 11</u>
Line 19, in Claim 25, delete "23 dyne/cm" and insert
 -- 23 dynes/cm --, therefor.

Signed and Sealed this

Fifteenth Day of April, 2008

JON W. DUDAS
*Director of the United States Patent and Trademark Office*